US010312054B2

(12) United States Patent
Hori et al.

(10) Patent No.: US 10,312,054 B2
(45) Date of Patent: Jun. 4, 2019

(54) RADICAL GENERATOR AND MOLECULAR BEAM EPITAXY APPARATUS

(71) Applicants: NATIONAL UNIVERSITY CORPORATION NAGOYA UNIVERSITY, Nagoya-shi (JP); NU SYSTEM INCORPORATED, Nagoya-shi (JP)

(72) Inventors: Masaru Hori, Nagoya (JP); Osamu Oda, Nagoya (JP); Hiroyuki Kano, Miyoshi (JP)

(73) Assignees: NATIONAL UNIVERSITY CORPORATION NAGOYA UNIVERSITY, Nagoya-Shi, Aichi (JP); NU-REI CO., LTD., Nagoya (JP)

( * ) Notice: Subject to any disclaimer, the term of this patent is extended or adjusted under 35 U.S.C. 154(b) by 386 days.

(21) Appl. No.: 14/910,650

(22) PCT Filed: Feb. 23, 2015

(86) PCT No.: PCT/JP2015/000864
§ 371 (c)(1),
(2) Date: Feb. 5, 2016

(87) PCT Pub. No.: WO2015/125493
PCT Pub. Date: Aug. 27, 2015

(65) Prior Publication Data
US 2016/0181068 A1    Jun. 23, 2016

(30) Foreign Application Priority Data
Feb. 24, 2014    (JP) .................................. 2014-033099

(51) Int. Cl.
*H01J 37/32*    (2006.01)
*H05H 1/46*    (2006.01)
(Continued)

(52) U.S. Cl.
CPC .... *H01J 37/32091* (2013.01); *C23C 14/0026* (2013.01); *C30B 23/066* (2013.01);
(Continued)

(58) Field of Classification Search
CPC .................................................. C23C 16/517
(Continued)

(56) References Cited

U.S. PATENT DOCUMENTS 6,017,221 A * 1/2000 Flamm .................. H01J 37/321
204/192.32
2007/0246163 A1* 10/2007 Paterson ............... C23C 16/458
156/345.48
(Continued)

FOREIGN PATENT DOCUMENTS

JP    H06-342764 A    12/1994
JP    2001-115265 A    4/2001
(Continued)

OTHER PUBLICATIONS

International Search Report (ISR) (PCT Form PCT/ISA/210), in PCT/JP2015/000864, dated May 19, 2015.
(Continued)

*Primary Examiner* — Rakesh K Dhingra
(74) *Attorney, Agent, or Firm* — McGinn LP Law Group, PLLC.

(57) ABSTRACT

[Object] To provide a radical generator which can produce radicals at higher density.
[Means for Solution] The radical generator includes a supply tube 10 made of SUS, a hollow cylindrical plasma-generating tube 11 which is connected to the supply tube 10 and which is made of pyrolytic boron nitride (PBN). A first cylindrical CCP electrode 13 and a second cylindrical CCP electrode 30 are disposed outside the plasma-generating tube 11. A coil 12 is provided so as to wind about the outer
(Continued)

circumference of the plasma-generating tube 11 at the downstream end of the first CCP electrode 13. A thin connecting tube 23 extending from the bottom of the plasma-generating tube 11 is inserted into the supply tube 10.

19 Claims, 3 Drawing Sheets

(51) Int. Cl.
    *H05H 1/30*     (2006.01)
    *C23C 14/00*     (2006.01)
    *C30B 23/06*     (2006.01)

(52) U.S. Cl.
    CPC ......... *H01J 37/321* (2013.01); *H01J 37/3211* (2013.01); *H01J 37/3244* (2013.01); *H01J 37/32183* (2013.01); *H01J 37/32467* (2013.01); *H01J 37/32568* (2013.01); *H01J 37/32669* (2013.01); *H05H 1/30* (2013.01); *H05H 1/46* (2013.01); *H01J 2237/327* (2013.01); *H01J 2237/3321* (2013.01); *H01J 2237/3326* (2013.01); *H05H 2001/4667* (2013.01); *H05H 2001/4675* (2013.01)

(58) Field of Classification Search
    USPC ............... 118/723 E, 723 ER, 723 I, 723 IR; 156/345.43–345.47, 345.48, 345.49; 315/111.21
    See application file for complete search history.

(56) References Cited

U.S. PATENT DOCUMENTS

| | | | | |
|---|---|---|---|---|
| 2009/0081811 | A1* | 3/2009 | Benjamin | H01J 37/32045 438/5 |
| 2011/0298376 | A1* | 12/2011 | Kanegae | B01J 19/088 315/111.51 |
| 2013/0220223 | A1 | 8/2013 | Hori et al. | |

FOREIGN PATENT DOCUMENTS

| | | | | |
|---|---|---|---|---|
| JP | 2009-004157 | A | | 1/2009 |
| JP | 2012-049028 | A | | 3/2012 |
| JP | 2012-049375 | A | | 3/2012 |
| JP | WO2012026113 | | * | 3/2012 |
| WO | WO 2010/082561 | | | 7/2010 |
| WO | WO 2013/045636 | A2 | | 4/2013 |

OTHER PUBLICATIONS

Extended European Search Report dated Aug. 3, 2017 in European Application No. 15752360.6.

Japanese Office Action, dated Nov. 27, 2018, in Japanese Application No. 2016-503985 and English Translation thereof.

\* cited by examiner

RADICAL GENERATOR AND MOLECULAR BEAM EPITAXY APPARATUS

TECHNICAL FIELD

The present invention relates to a radical generator for generating high-density radicals and a molecular beam epitaxy (MBE) apparatus using the radical generator. More particularly, it relates to a radical generator for generating radicals by the mediation of an ICP plasma in combination with a CCP plasma, and an MBE apparatus using the radical generator, which attains a high film formation rate.

BACKGROUND ART

A Group III nitride semiconductor crystal is conventionally known to be also formed through a technique such as molecular beam epitaxy (MBE). In the case where a Group III nitride semiconductor crystal is formed through MBE, atom vapors of Group III element and nitrogen are required as raw materials. The Group III element, which assumes the form of solid metal, is generally placed in a crucible made of PBN (pyrolytic boron nitride) and heated in the crucible, to thereby generate atomic vapor. In contrast, nitrogen assumes the form of gas under ambient conditions, vapor of nitrogen atoms is generally generated by, for example, decomposing molecular nitrogen gas or ammonia. In one procedure of forming atomic nitrogen vapor through decomposition of molecular nitrogen gas, a nitrogen radical generator which employs an inductively coupled plasma generated by applying high-frequency power to a coil-form electrode is employed. In order to enhance the growth rate of a Group III nitride semiconductor by means of a nitrogen radical generator, the nitrogen radical energy and flux density must be enhanced.

The present inventors developed a radical generator which can generate high-density radicals disclosed in Patent Document 1, and a molecular beam epitaxy (MBE) apparatus disclosed in Patent Document 2. The radical generator disclosed in Patent Document 1 has a plasma-generating tube made of a dielectric material, which is connected to a supply tube for supplying a gas at the downstream end thereof, a coil which is disposed around the outer wall of the plasma-generating tube, for generating an inductively coupled plasma in the plasma-generating tube, and an electrode which is disposed around the outer wall of the plasma-generating tube and more proximal to the supply tube than the coil is, for generating a first capacitively coupled plasma in the plasma-generating tube and adding the first capacitively coupled plasma to the inductively coupled plasma. This apparatus can generate a high-density, plasma having a high energy by injecting the plasma having a high energy generated through capacitive coupling to the high-density plasma generated through inductive coupling.

PRIOR ART DOCUMENT

Patent Document

Patent Document 1: Japanese Patent Application Laid-Open (kokai) No. 2012-049028
Patent Document 2: Japanese Patent Application Laid-Open (kokai) No. 2012-049375

SUMMARY OF THE INVENTION

Problems to be Solved by the Invention

However, the radical generator of Patent Document 1 has the following problem. Since a region for generating CCP (capacitively coupled plasma) is disposed in a position distant from an opening for releasing radicals, energy is reduced due to collision with the wall of the plasma-generating tube or collision between plasma, resulting in a reduction in the energy or density of the radicals released. Particularly for achieving a nitrogen radical generator of a MBE apparatus forming Group III nitride semiconductor, there is demand for a radical generator which attains higher radical density.

In view of the foregoing, an object of the present invention is to provide a radical generator which can produce higher-internal-energy and high-density radicals.

Means for Solving the Problems

In one aspect of the present invention, there is provided a radical generator comprising:
a supply tube for supplying a gas;
a plasma-generating tube made of a dielectric material, the plasma-generating tube being connected to the supply tube at the downstream end thereof;
a coil disposed around the outer wall of the plasma-generating tube, for generating an inductively coupled plasma in the plasma-generating tube;
a first electrode which is disposed around the outer wall of the plasma-generating tube and more proximal to the supply tube than the coil is, for generating a first capacitively coupled plasma in the plasma-generating tube and adding the first capacitively coupled plasma to the inductively coupled plasma; and
a second electrode which is disposed around the outer wall of the plasma-generating tube and more proximal to the downstream end of the plasma-generating tube than the coil is, for generating a second capacitively coupled plasma in the plasma-generating tube and adding the second capacitively coupled plasma to the first capacitively coupled plasma and the inductively coupled plasma which are flowing to the downstream.

In the present invention, the opening of the plasma-generating tube through which the generated plasma is released has a tapered portion increasing in diameter toward the downstream, and the second electrode is arranged around the outer wall of the tapered portion.

Moreover, in the present invention, there may be provided a power supply apparatus comprising:
a high-frequency power source for generating high-frequency electric power;
a distributor for distributing high-frequency electric power output from the high-frequency power source to the first electrode, the coil, and the second electrode, and which has an impedance matching unit with a function of matching impedance with the high-frequency power source; and
a control unit for variably controlling the electric power distributed to the first electrode, the coil, and the second electrode according to the external command. The apparatus can adjust the density ratio of the first capacitively coupled plasma, the inductively coupled plasma, and the second capacitively coupled plasma, and appropriately control the density of the plasma released through the opening, the density and energy of the radical output from the apparatus.

In the present invention, there is a connecting tube extending continuously from the bottom of the plasma-generating tube, which is inserted from the opening of the supply tube at the connection site between the supply tube and the plasma-generating tube, and the supply tube is preferably made of a conductive material. There is also provided a parasitic-plasma-preventing tube which is made of a dielectric material, which is connected to the opening of the supply tube proximal to the connection site between the supply tube and the plasma-generating tube, and which covers the inner wall of the supply tube, and the supply tube may be made of a conductive material.

By virtue of the supply tube, a gas of interest can be supplied to the plasma-generating tube. Examples of the gas include nitrogen, oxygen, hydrogen, ammonia, water, a fluorocarbon, a hydrocarbon, silane, and germane. Radicals of interest can be produced from the gases. Among these gases, nitrogen, oxygen, hydrogen, and ammonia are particularly useful for generating radicals. These gases may be diluted with a rare gas such as argon.

The connecting tube or the parasitic-plasma-preventing tube is disposed so as to prevent a drop in radical density, which would otherwise be caused by generation of a parasitic plasma between the electrode and the inner wall of the supply tube. The plasma-generating tube and the connecting tube continuously extending therefrom, or the parasitic-plasma-preventing tube may be made of a ceramic material such as BN, PBN, $Al_2O_3$, or $SiO_2$.

The inner diameter of the zone of the plasma-generating tube where a first capacitively coupled plasma is generated, that of the zone of the plasma-generating tube where an inductively coupled plasma is generated, and that of the zone of the plasma-generating tube where a second capacitively coupled plasma is generated may be identical to or different from each other.

In the present invention, the radical generator preferably further comprises a plurality of permanent magnets which are disposed along the outer circumference of the zone of the plasma-generating tube where a first capacitively coupled plasma or a second capacitively coupled plasma is generated, and which localize the first capacitively coupled plasma or the second capacitively coupled plasma to the center of the plasma-generating tube. The permanent magnets preferably have a high Curie temperature for preventing degaussing and may be made of, for example, an Sm—Co magnet or an Al—Ni—Co magnet. Electromagnets being energized may be provided instead of permanent magnets, or electromagnets may be provided in addition to the permanent magnets.

In the present invention, the first electrode and the second electrode preferably have an inner space in which water can be refluxed. This allows the cooling of the first electrode and the second electrode, and the stable generation of high-energy capacitively coupled plasma Moreover, in the present invention, the permanent magnets or the electromagnets are preferably disposed inside at least one electrode of the first electrode and the second electrode so as to be exposed to the inner space of the electrode.

In the present invention, the first electrode or the second electrode preferably has a cylindrical shape.

In the present invention, nitrogen is supplied through the supply tube, to thereby generate nitrogen radicals.

In the other aspect of the present invention, there is provided a molecular beam epitaxy apparatus comprising the above radical generator. This can achieve a molecular beam epitaxy apparatus having a radical generator which generates high-energy and high-density radicals. The molecular beam epitaxy apparatus can attain an improved film formation rate of Group III nitride semiconductor particularly by supplying nitrogen radicals.

Effect of the Invention

In the present invention, since a first electrode, a coil, and a second electrode are arranged along the direction of gas flow, a first capacitively coupled plasma, an inductively coupled plasma, and a second capacitively coupled plasma are generated along the direction of gas flow in the plasma-generating tube. The first capacitively coupled plasma with high energy is added to the high-density inductively coupled plasma, and thereby the plasma density is further improved in that region. As the plasma moves toward the opening or the plasma collides with the wall of the opening when being released, the density of the plasma with high energy is reduced. However, since the second capacitively coupled plasma with high energy is added in the vicinity of the opening of the plasma-generating tube from which plasma is radiated, radicals released from the opening of the present radical generator have high energy and high density. Thus, for example, an apparatus can be achieved which can supply nitrogen radicals, thereby improving the film formation rate of Group III nitride semiconductor.

When the opening of the plasma-generating tube from which plasma is released is the tapered portion having a larger diameter toward the downstream, and a second electrode is arranged around the outer wall of the tapered portion, higher-energy and high-density plasma can be obtained, and the beam diameter of plasma can be increased. As a result, radicals released from the opening of the present plasma generator can have high energy, high density, and larger beam diameters. Thereby, the molecular beam epitaxy apparatus using the radical generator of the present invention can increase the area and speed of film formation.

When the connecting tube extending continuously from the plasma-generating tube or the parasitic-plasma-preventing tube is used, generation of a parasitic plasma in the supply tube, which would otherwise be caused by electric discharge between the inner wall of the supply tube and the capacitively coupled plasma electrode, can be prevented. As a result, a capacitively coupled plasma is generated solely in the plasma-generating tube, whereby the plasma density increases. In this case, radical formation performance on the basis of a capacitively coupled plasma can be enhanced, to thereby realize a radical generator which can provide higher-density radicals.

Moreover, in the case where a device is provided which variably controls the power distributed to the first electrode, the coil, and the second electrode by the external command, the energy and density ratio of the first capacitively coupled plasma, the inductively coupled plasma, the second capacitively coupled plasma in the generated plasma can be controlled, and plasma having required characteristic is generated. As a result, the present apparatus can irradiate high-energy and high-density radicals.

In the case where the permanent magnets or the electromagnets are used, a state can be reached in which the first capacitively coupled plasma or the second capacitively coupled plasma is localized at high density in the center of the plasma-generating tube. Thus, the first capacitively coupled plasma can be efficiently added to an inductively coupled plasma. The plasma energy and density at the center of the plasma irradiated outside can be improved. That is, in the case where the gas pressure is elevated for increasing the radical flux density, a decrease in inductively coupled plasma density at the center of the plasma-generating tube can be compensated. Thus, higher-density radicals can be generated. Meanwhile, there are many electrons having high energy in the capacitively coupled plasma. When such electrons are added to the inductively coupled plasma, decomposition of gas molecules to the corresponding gas atoms can be promoted, and atomic radicals can gain high internal energy.

In the case where the first electrode and the second electrode have an inner space in which water can be refluxed, rise in temperature of the first capacitively coupled plasma electrode and the second capacitively coupled plasma electrode can be suppressed. Also, since the magnets can be cooled through direct immersion in water, degaussing of the magnets can be suppressed, whereby generation of high-density radicals can be maintained for a long period of time.

In the case where the gas is nitrogen, the radical generator of the present invention can generate nitrogen radicals at high density. In addition, since decomposition of nitrogen molecules to nitrogen atoms can be performed at high efficiency, the internal energy of nitrogen atoms can be elevated. Such nitrogen atom radicals having high internal energy are very useful in crystal growth of a nitride compound such as a Group III nitride semiconductor, since the radicals can lower the growth temperature.

MODES FOR CARRYING OUT THE INVENTION

Specific embodiments of the present invention will next be described in detail with reference to the drawings. However, these embodiments should not be construed as limiting the present invention thereto.

Embodiment 1

Figure 1:
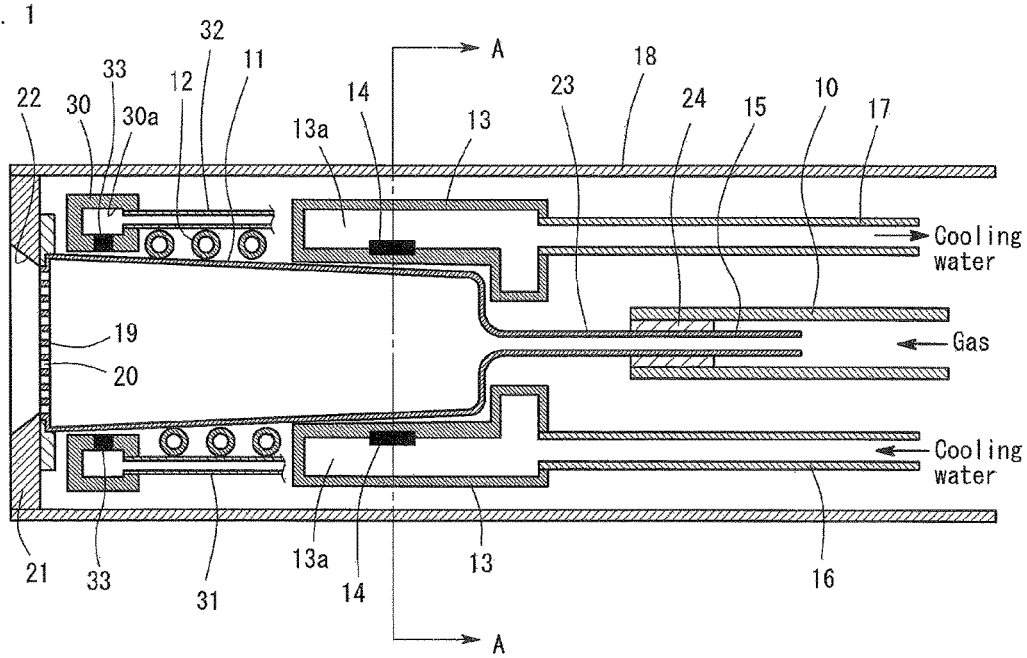
FIG. 1 A cross-section parallel to the axial direction showing the configuration of the radical generator of the Embodiment 1.
Figure 2:
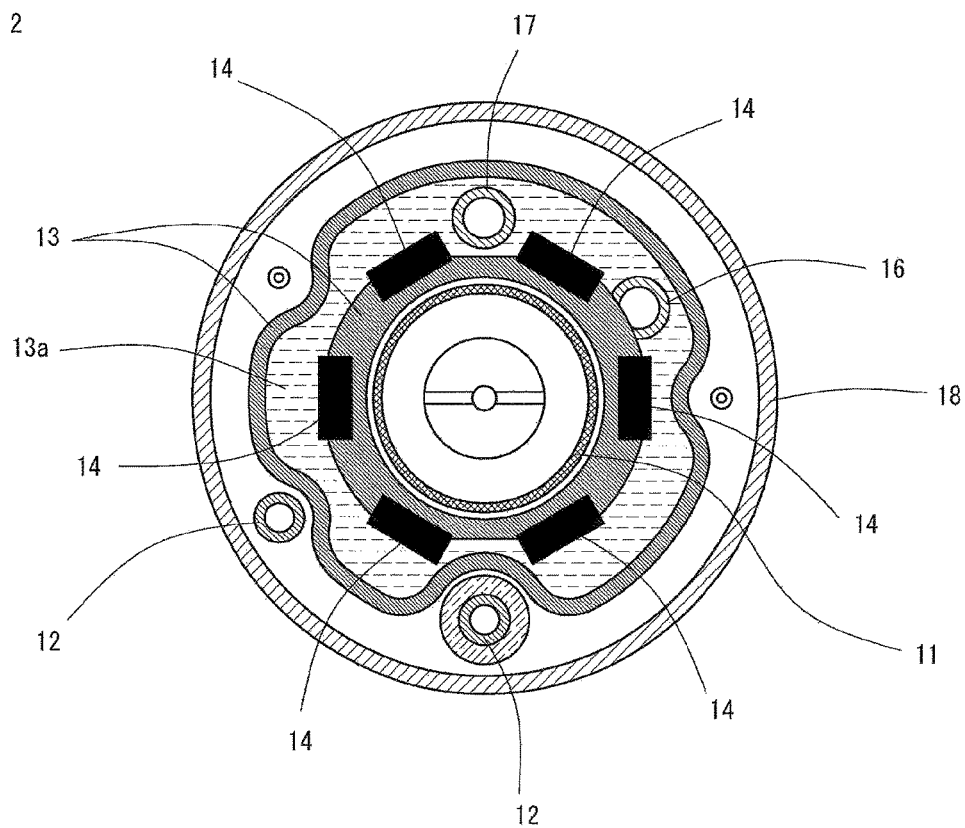
FIG. 2 A cross-section of the radical generator of the Embodiment 1, cut along A-A shown in FIG. 1.

FIG. 1 is a cross-section parallel to the axial direction showing the configuration of the radical generator of the Embodiment 1. FIG. 2 is a cross-section of the radical generator of the Embodiment 1, cut along A-A shown in FIG. 1.

As shown in FIGS. 1 and 2, the radical generator of Embodiment 1 has a metallic casing 18, a metallic end plate 21 disposed at an end of the casing 18, a supply tube 10 made of SUS, and a cylindrical plasma-generating tube 11 which is connected to the supply tube 10 and which is made of pyrolytic boron nitride (PBN). At the center of the end plate 21 there is provided with an opening 22 through which the generated radicals are output. The plasma-generating tube 11 has an inner diameter of 72 mm and a length of 145 mm. An orifice plate 19 is disposed at the opening of the plasma-generating tube 11 which opening is disposed opposite the connection side of the supply tube 10. The orifice plate 19 has a plurality of pores 20 with a diameter of 0.2 mm at the opening of the plasma-generating tube 11.

A double-pipe cylindrical first CCP electrode 13 (first electrode) is disposed in the vicinity of the connection portion between the supply tube 10 and the plasma-generating tube 11 and outside the plasma-generating tube 11. The first CCP electrode 13 has an inner space 13a defined by the double-pipe cylinder. To the first CCP electrode 13, a water-supplying tube 16 and a water-discharging tube 17 are connected. Thus, the inner space 13a of the first CCP electrode 13 is communicated with the water-supplying tube 16 and the water-discharging tube 17. Through this configuration, cooling water can be supplied via the water-supplying tube 16 to the inner space 13a of the first CCP electrode 13, the water can be uniformly circulated inside the whole inner space 13a, and the water can be discharged through the water-discharging tube 17, whereby the first CCP electrode 13 can be cooled through refluxing cooling water. The first CCP electrode 13, the water-supplying tube 16, and the water-discharging tube 17 are made of SUS.

The inner wall of the first CCP electrode 13 (i.e., the inner space 13a) is provided with twelve permanent magnets 14 which are disposed along the circular outer circumference of the zone of the plasma-generating tube 11 at the equal intervals. The permanent magnets 14 are made of SmCo. Each permanent magnet 14 has been magnetized in the direction orthogonal to the cylinder center axis (i.e., magnet thickness direction), and the plane proximal to the plasma-generating tube 11 has been magnetized as an N pole or an S pole. The two permanent magnets 14 adjacent each other have inner planes (planes proximal to the plasma-generating tube 11) of different magnetic poles. That is, the inner planes of the permanent magnets 14 are magnetized such that an N pole and an S pole are alternatingly repeated along the circumferential direction. These permanent magnets 14 are exposed to the inner space 13a of the first CCP electrode 13. Thus, when cooling water is refluxed through the inner space 13a of the first CCP electrode 13 so as to cool the first CCP electrode 13, the cooling water comes into direct contact with the permanent magnets 14. In this case, rise in temperature of the permanent magnets 14, which would otherwise be caused by heating of the first CCP electrode 13, can be effectively suppressed.

A coil 12 is disposed so that the coil winds about the outer circumference of the plasma-generating tube 11. The coil 12 is located outside the plasma-generating tube 11 and at the downstream end of the first CCP electrode 13 (i.e., gas flow direction, opposite the supply tube 10 side). The coil 12 is formed of a hollow copper tube which has been wound 3.5 times. The coil 12 can be cooled through passage of cooling water in the inner space of the copper tube. The outside of the copper tube is silver plated, and the sheath of the copper tube constitutes a feeder line.

A double-pipe cylindrical second CCP electrode 30 (second electrode) is disposed at the downstream end of the coil 12 and outside the plasma-generating tube 11 in the vicinity of the orifice plate 19. The second CCP electrode 30 has an inner space 30a defined by the double-pipe cylinder as in the first CCP electrode 13. To the second CCP electrode 30, a water-supplying tube 31 and a water-discharging tube 32 are connected. Thus, the inner space 30a of the second CCP electrode 30 is communicated with the water-supplying tube 31 and the water-discharging tube 32. Through this configuration, cooling water can be supplied via the water-supplying tube 31 to the inner space 30a of the second CCP electrode 30, the water can be uniformly circulated inside the whole inner space 30a, and the water can be discharged through the water-discharging tube 32, whereby the second CCP electrode 30 can be cooled through refluxing cooling water. The second CCP electrode 30, the water-supplying tube 31, and the water-discharging tube 32 are made of SUS.

The inside of the second CCP electrode 30 (i.e., the inner space 30a) is provided with twelve permanent magnets 33 which are disposed along the circular outer circumference of the zone of the plasma-generating tube 11 at the equal intervals. The permanent magnets 33 are made of SmCo. Each permanent magnet 33 has been magnetized in the same direction, and magnetized as the same pole as in the permanent magnet 14. These permanent magnets 33 are exposed to the inner space 30a of the second CCP electrode 30. Thus, when cooling water is refluxed through the inner space 30a of the second CCP electrode 30 so as to cool the second CCP electrode 30, the cooling water comes into direct contact with the permanent magnets 33. In this case, rise in temperature of the permanent magnets 33, which would otherwise be caused by heating of the second CCP electrode 30, can be effectively suppressed.

The first CCP electrode 13 is supplied with power from the sheaths of the water-supplying tube 16 and the water-discharging tube 17 connected to the first CCP electrode 13. The second CCP electrode 30 is supplied with power from the sheaths of the water-supplying tube 31 and the water-discharging tube 32 connected to the second CCP electrode 30. The supply tube 10, the casing 18, and the end plate 21 remain at the same voltage and are grounded. One end of the coil 12 is grounded via a condenser (100 pF to 200 pF). In this case, plasma generation is ensured and high-density radicals generated by the radical generator are maintained. The water-supplying tube 16 and the water-discharging tube 17, and the water-supplying tube 31 and the water-discharging tube 32 are respectively a feeder (live line) to apply voltage, and a ground wire is the plasmas generated in the plasma-generating tube 11 and the casing 18. Since the first CCP electrode 13 and the second CCP electrode 30 encircle the outer wall of the plasma-generating tube 11, they generate an AC electric field radially to the center axis (gas flow direction) of the plasma-generating tube 11 and an AC magnetic field in a concentric circle perpendicularly to the electric field. The coil 12 generates an AC magnetic field parallel to the center axis of the plasma-generating tube 11 and an AC electric field in a concentric circle perpendicularly to the magnetic field.

To the first CCP electrode 13 and the second CCP electrode 30, a power supply apparatus 60 (FIG. 3) which supplies high-frequency electric power of 13.56 Hz is connected. High-frequency electric power is applied to the coil 12 by the power supply apparatus 60, thereby an inductively coupled plasma is generated along the axial direction in the zone inside the plasma-generating tube 11 where the coil 12 is disposed at the outer circumference of the tube. Also, high-frequency electric power is applied to the first CCP electrode and the second CCP electrode 30 by the power supply apparatus 60, thereby a first capacitively coupled plasma and a second capacitively coupled plasma are respectively generated along the axial direction in the zones inside the plasma-generating tube 11 where the first CCP electrode 13 and the second CCP electrode 30 are disposed at the outer circumference of the tube.

Figure 3:
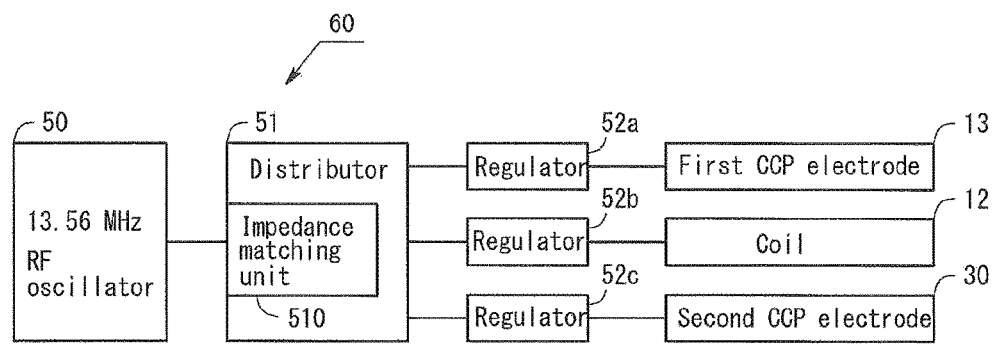
FIG. 3 A schematic view of the configuration of power supply device.

As shown in FIG. 3, the power supply apparatus 60 comprises a RF oscillator (high-frequency power source) 50, a distributor 51, and regulators (control units) 52a, 52b, and 52c. The distributor 51 distributes the electric power to three of the first electrode, the coil, and the second electrode. And the distributor 51 has an impedance matching unit 510 with a function of matching impedance between the RF oscillator (high-frequency power source) 50 and the output end of the distributed power. The regulators (control units) 52a, 52b, and 52c variably control the strength of the electric power distributed to three by the distributor according to the external instructions. The outputs of the regulator 52a, the regulator 52b, and the regulator 52c are connected to the first CCP electrode 13, the coil 12, and the second CCP electrode, respectively. The regulators 52a, 52b, and 52c can adjust independently the energy and the density of the first capacitively coupled plasma, the inductively coupled plasma, and the second capacitively coupled plasma, thereby radicals with an optimum energy and density can be irradiated from the orifice plate 19.

In a connecting side of the plasma-generating tube 11 to the supply tube 10, a thin connecting tube 23 extends continuously from the bottom of the plasma-generating tube 11, which is connected to the supply tube 10 by a ring joint member 24 provided around the connecting tube 23. The connecting tube 23 has an inner diameter of 4 mm at the end being connected to the supply tube 10. The connecting tube 23 has a length of 88 mm. The presence of the connecting tube 23 increases a distance between the first CCP electrode 13 and the inner wall of the supply tube 10, whereby generation of a parasitic plasma is prevented therebetween. In order to effectively prevent generation of a parasitic plasma, the length of the connecting tube 23 is preferably 10 times or more the inner diameter of the supply tube 10, more preferably 20 to 50 times the inner diameter of the supply tube 10. The parasitic-plasma-preventing tube having a shape and dimensions similar to those of the connecting tube 23 and being made of a dielectric material, which is separated from the plasma-generating tube 11, may connect the bottom of the plasma-generating tube 11 and the supply tube 10 instead of extending the connecting tube 23 continuously from the bottom of the plasma-generating tube 11.

The plasma-generating tube 11, the coil 12, the first CCP electrode 13, and second CCP electrode 30 are built in the cylindrical casing 18. The radical-radiating end of the casing 18 is connected to the end plate 21 having the opening 22 at the center thereof. An additional electrode for removing ions (not illustrated) or an additional magnet (not illustrated) may be disposed in the vicinity of the opening 22.

In use of the radical generator of Embodiment 1, a gas is supplied to the plasma-generating tube 11 through the supply tube 10. Then, high-frequency electric power is applied to the coil 12 and the CCP electrode 13, to thereby generate an inductively coupled plasma, a first capacitively coupled plasma, and a second capacitively coupled plasma in the plasma-generating tube 11. The first capacitively coupled plasma is added to the inductively coupled plasma, the second capacitively coupled plasma is further added near at the opening of the plasma-generating tube 11. Thus, high-density radicals can be released from the pores 20 of the orifice plate 19.

In the radical generator of Embodiment 1, the thin connecting tube 23 extending from the bottom of the plasma-generating tube 11 is inserted into the supply tube 10, to thereby prevent generation of a parasitic plasma in the supply tube 10, which would otherwise be caused by electric discharge between the first CCP electrode 13 and the inner wall of the supply tube 10. Through insertion of the connecting tube 23, the first capacitively coupled plasma is generated only in the plasma-generating tube 11, and the plasma density of the first capacitively coupled plasma is enhanced. Thus, the density of the generated radicals is also enhanced.

The first capacitively coupled plasma and the second capacitively coupled plasma are localized at high density in the center of the plasma-generating tube 11 by the mediation of a cusp field provided by the twelve permanent magnets 14 and 33. Specifically, a magnetic flux is formed from the N-polar inner plane of one permanent magnet 14 or permanent magnet 33 to the S-polar inner plane of one permanent magnet 14 or permanent magnet 33 adjacent thereto, whereby arc-shape magnetic flux units are formed at intervals of 60 degrees. The plasma is expelled from the magnetic flux units, whereby the capacitively coupled plasma is localized at high density in the center of the plasma-generating tube 11. In the case where high gas pressure is employed in order to enhance molecule decomposition performance, the inductively coupled plasma is generally in the low-bright mode, rather than in the high-bright mode. The "high-bright mode" is a state in which a plasma is generated in the center of the plasma-generating tube 11, with the radical density being higher in the vicinity of the center. In contrast, the "low-bright mode" is a state in which a plasma is generated along the inner wall of the plasma-generating tube 11, with the plasma density being lower in the vicinity of the center. In this case, the entire radical density is low, and the output radicals have a low density.

However, through adding a first capacitively coupled plasma localized to the center to the inductively coupled plasma, the low-bright-mode plasma is modified, to thereby compensate lowering in plasma density at the center. As a result, even when high gas pressure is employed, the plasma density at the center is enhanced, and considerably high radical density can be attained, as compared with the case in which only an inductively coupled plasma is generated. In addition, by virtue of a large number of high-energy electrons present in the first capacitively coupled plasma, gas molecules are effectively decomposed to the corresponding gas atoms, and the thus-generated atomic radicals come to have an enhanced internal energy.

A second capacitively coupled plasma is generated along the axial direction in the zone inside the plasma-generating tube 11 where the second CCP electrode 30 is disposed in the vicinity of the orifice plate 19. In this case, although the energy and density of a mixture plasma of the first capacitively coupled plasma and the inductively coupled plasma are decreased in the process of flowing to the vicinity of the orifice plate 19, the second capacitively coupled plasma in the high-bright mode in which the radical density being higher in the vicinity of the center axis of the plasma-generating tube 11 can be injected to the mixture plasma. As a result, the radicals output from the orifice plate 19 can have a high energy and high density. When such high-density atomic radicals having high internal energy are employed in, for example, a source element of crystal growth, growth temperature can be lowered, which is very advantageous.

In addition, the permanent magnets 14 and 33 can be directly cooled by refluxing cooling water through the inner spaces 13a and 30a of the first CCP electrode 13 and the second CCP electrode 30, whereby rise in temperature of the permanent magnets 14 and 33 is suppressed, to thereby effectively prevent degaussing of the permanent magnets 14 and 33. As a result, the first CCP plasma and the second CCP plasma localized to the center of the plasma-generating tube 11 can be maintained for a long period of time, and high-density radical generation can be maintained for a long period of time.

The permanent magnets 14 and 33 do not necessarily exist. Only either one may exist. Electromagnets may be substituted for the permanent magnets or may be added to the permanent magnets.

The radical generator of Embodiment 1 can generate any radical species through supply of a gas of interest via the supply tube 10. Examples of the gas to be supplied include nitrogen, oxygen, hydrogen, ammonia, water, fluorocarbon, hydrocarbon, silane, and germane. Any radical species of interest may be obtained from these gases. Among these gases, nitrogen, oxygen, hydrogen, and ammonia are used for generating useful radicals. When a gas is supplied through the supply tube 10, the gas may be diluted with a rare gas such as argon.

Embodiment 2

Figure 4:
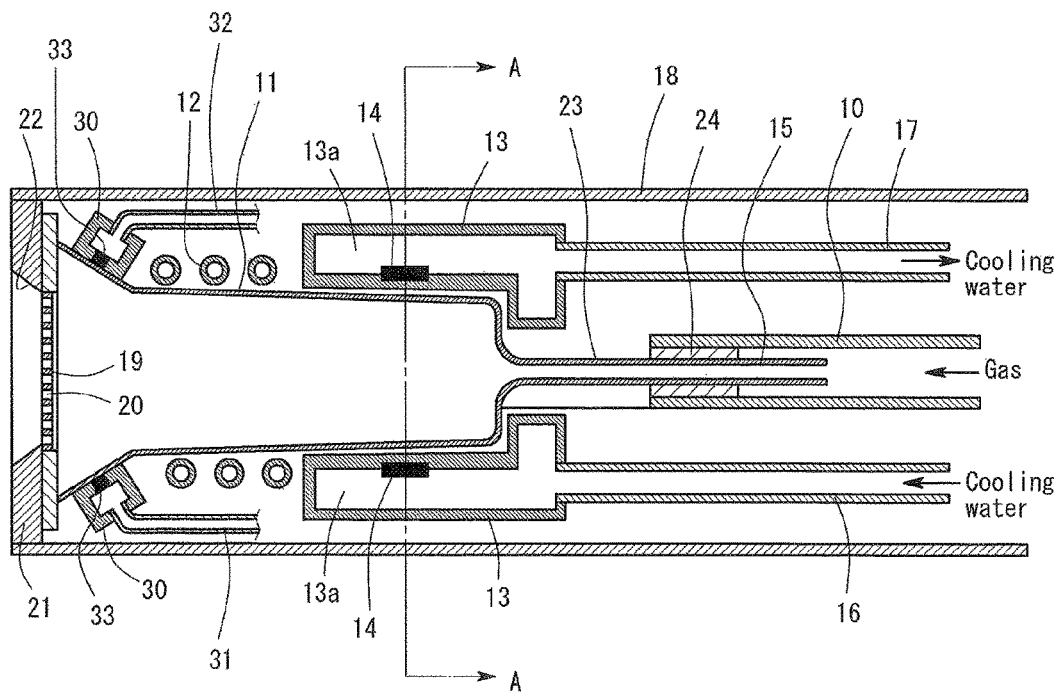
FIG. 4 A cross-section parallel to the axial direction showing the configuration of the radical generator of Embodiment 2.

FIG. 4 is a cross-section parallel to the axial direction showing the configuration of the radical generator of Embodiment 2. It is different from the radical generator of firs embodiment that the diameter of the plasma-generating tube 11 is increased closer to the orifice plate 19 along the axis in the vicinity of the opening of the plasma-generating tube 11. That is, in the vicinity of the opening, the plasma-generating tube 11 has a tapered shape toward the orifice plate 19. Thus, the plasma flux (density) in the vicinity of the center axis where the second capacitively coupled plasma is converged can be enhanced in a tapered shape. As a result, the diameter of the output radical beam can be increased without causing energy loss and density reduction. The inclination angle of the tapered portion is preferably 15° to 60°. In Embodiment 2, the permanent magnets do not necessarily exist. Only either one may exist. Electromagnets may be substituted for the permanent magnets or may be added to the permanent magnets as in Embodiment 1.

Embodiment 3

Figure 5:
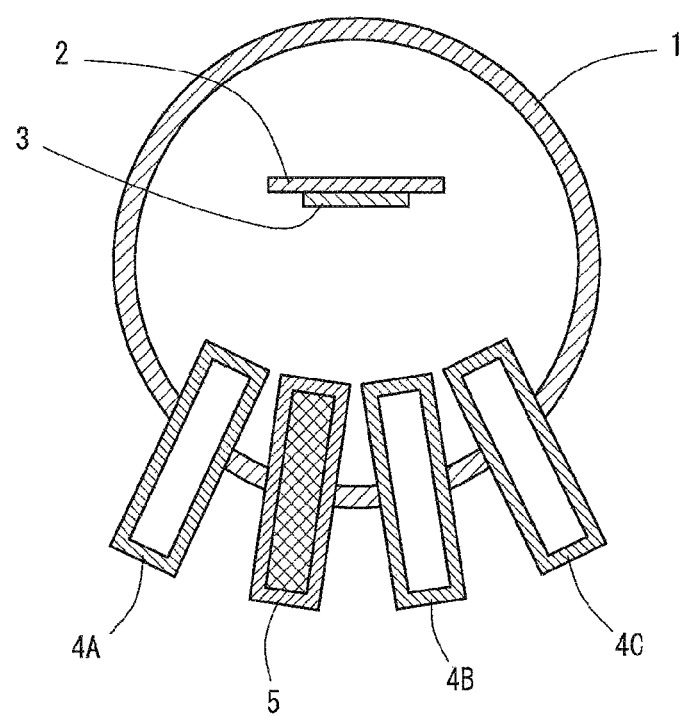
FIG. 5 A schematic view of the configuration of the MBE apparatus of Embodiment 3.

An MBE apparatus according to Embodiment 3 will next be described. FIG. 5 is a schematic view of the configuration of the MBE apparatus of Embodiment 3. As shown in FIG. 5, the MBE apparatus of Embodiment 3 has a vacuum chamber 1 whose inside can be maintained at about $10^{-8}$ Pa (i.e., ultra-vacuum), a substrate stage 2 disposed in the vacuum chamber 1 which can hold a substrate 3 and can rotate and heat the substrate 3, molecular beam cells 4A, 4B, and 4C which can radiate a molecular beam (atomic beam) onto the surface of the substrate 3, and a radical generator 5 for supplying nitrogen radicals onto the surface of the substrate 3.

In use of the MBE apparatus of Embodiment 3, the surface of the substrate 3 which has been heated and maintained in ultra-vacuum is irradiated with Group III metal atomic beams supplied by molecular beam cells 4A, 4B, and 4C, and with nitrogen radicals supplied by the radical generator 5, whereby a Group III nitride semiconductor crystal is formed on the surface of the substrate 3.

Each of the molecular beam cells 4A, 4B, and 4C has a crucible for holding a Group III metal material, a heater for heating the crucible, and a shutter. The crucible is heated to thereby generate a Group III metal vapor, and an atomic beam of the metal element is formed. The dose of the atomic beam is regulated through opening/shutting the shutter. In one embodiment, the molecular beam cell 4A contains Ga, the molecular beam cell 4B contains In, and the molecular beam cell 4C contains Al, and atomic beams of respective elements are generated. An additional molecular cell 4 holding an n-type impurity (e.g., Si) or a p-type impurity (e.g., Mg) may be provided, and the substrate 3 may be irradiated with the molecular beam provided by the molecular beam cell 4.

The radical generator 5 has the same structure as that of the radical generator of Embodiment 1 (see FIGS. 1 and 2) or the structure as that of the radical generator of Embodiment 2 (see FIG. 4). In Embodiment 3, nitrogen gas is supplied through the supply tube 10 to the plasma-generating tube 11, where nitrogen gas is decomposed. As described in Embodiment 1, the first capacitively coupled plasma and the second capacitively coupled plasma are localized at high density in the center of the plasma-generating tube 11 by the mediation of a cusp field provided by the twelve permanent magnets 14 and twelve permanent magnets 33. In the case where high gas pressure is employed in order to enhance nitrogen molecule decomposition performance, the inductively coupled plasma is in the low-bright mode, and the radical density is low in the center of the plasma-generating tube 11. However, through adding the first capacitively coupled plasma localized to the center to the inductively coupled plasma, the low-bright-mode plasma is modified, to thereby compensate lowering in plasma density at the center. The second capacitively coupled plasma is generated in the vicinity of the opening of the plasma generating tube 11, thereby high-energy plasma is supplied. As a result, even when high gas pressure is employed, the plasma density at the center is enhanced, and considerably high radical density can be attained, as compared with the case in which only an inductively coupled plasma is generated. In addition, by virtue of a large number of high-energy electrons present in the first capacitively coupled plasma and the second capacitively coupled plasma, nitrogen gas molecules are effectively decomposed to the corresponding gas atoms, and the thus-generated atomic radicals come to have an enhanced internal energy.

The MBE apparatus of Embodiment 3 has the aforementioned radical generator 5, which can provide high nitrogen radical density as described above. Therefore, the MBE apparatus attains an enhanced Group III nitride semiconductor film formation rate, as compared with a conventional MBE apparatus. In addition, since the MBE apparatus of the invention can emit nitrogen radicals having high internal energy, migration of nitrogen on the surface of the crystal can be promoted. In other words, the nitrogen atoms satisfactorily move in the surface layer of the crystal and reach growth sites at higher possibility, whereby the crystallinity of the grown crystal as well as the sharpness of a composition change at the interlayer interface can be enhanced. Furthermore, the temperature of the substrate 3 can be lowered, whereby the crystallinity can be further enhanced. Also, since the radical generator 5 enables continuous formation of nitrogen radicals for a long period of time, consistent Group III nitride semiconductor film formation is ensured for a long period of time.

INDUSTRIAL APPLICABILITY

The radical generator of the present invention can be employed as a nitrogen radical generator of a molecular beam epitaxy (MBE) apparatus or a similar apparatus, to thereby form a nitride such as a Group III nitride semiconductor. The radical generator of the present invention also finds a variety of applications such as cleaning of a substrate and substrate surface treatment based on radical radiation.

DESCRIPTION OF REFERENCE NUMERALS

1: Vacuum chamber
2: Substrate stage
3: Substrate
4A, 4B, 4C: Molecular beam cell
10: Supply tube
11: Plasma-generating tube
12: Coil
13: First CCP electrode
14: Permanent magnet
16: Water-supplying tube
17: Water-discharging tube
18: Casing
19: Orifice plate
20: Pore
21: End plate
22: Opening
23: Connecting tube
30: Second CCP electrode

The invention claimed is:
1. A radical generator, comprising:
a supply tube for supplying a gas;
a plasma-generating tube which is cylindrical and is made of a dielectric material, the plasma-generating tube comprising a connecting tube continuously extending from an upstream end of the plasma-generating tube as one body, an inner diameter of the connecting tube being smaller than an inner diameter of the plasma-generating tube, and the connecting tube being connected to the supply tube at a downstream end of the supply tube;
a coil winding around an outer wall of the plasma-generating tube, for generating an inductively coupled plasma in the plasma-generating tube;
a first electrode comprising a double-pipe cylinder having an inner space in which cooling material can be refluxed and covering the outer wall of the plasma-generating tube and which is disposed between the coil and the supply tube, for generating a first capacitively coupled plasma in the plasma-generating tube and adding the first capacitively coupled plasma to the inductively coupled plasma;
a plurality of first permanent magnets which are disposed along an outer circumference of a zone of the plasma-generating tube where the first capacitively coupled plasma is generated and which localize the first capacitively coupled plasma to about a cylinder center axis of the plasma-generating tube, wherein respective first permanent magnets have been magnetized in a direction orthogonal to the cylinder center axis of the plasma-generating tube, and a plane proximal to the plasma-generating tube has been magnetized as an N pole or an S pole, and two first permanent magnets adjacent each other have inner planes of different magnetic poles such that an N pole and an S Pole are alternatingly repeated along a circumferential direction of the plasma-generating tube; and
a second electrode comprising a, double-pipe cylinder having an inner space in which cooling material can be refluxed and covering the outer wall of the plasma-generating tube and more proximal to a downstream end of the plasma-generating tube than the coil is, for generating a second capacitively coupled plasma in the plasma-generating tube and adding the second capacitively coupled plasma to the first capacitively coupled plasma and the inductively coupled plasma which are flowing to the downstream of the plasma generating tube.

2. A radical generator according to claim 1:
wherein an opening of the plasma-generating tube through which a plasma generated in the plasma-generating tube is released comprises a tapered portion increasing in diameter toward the downstream, and the second electrode is arranged around an outer wall of the tapered portion.

3. The radical generator according to claim 2, wherein a connecting tube extending continuously from the bottom of the plasma-generating tube is inserted into an opening of the supply tube at a connection site between the supply tube and the plasma-generating tube, and the connecting tube is connected to the supply tube by a ring joint member provided around the connecting tube.

4. The radical generator according to claim 2, which further comprises a plurality of permanent magnets which are disposed along an outer circumference of a zone of the plasma-generating tube where the first capacitively coupled plasma or the second capacitively coupled plasma is generated, and which localize the first capacitively coupled plasma or the second capacitively coupled plasma to about a cylinder center axis of the plasma-generating tube, wherein respective permanent magnets have been magnetized in a direction orthogonal to the cylinder center axis of the plasma-generating tube, and a plane proximal to the plasma-generating tube has been magnetized as an N pole or an S pole, and two permanent magnets adjacent each other have inner planes of different magnetic poles such that an N pole and an S pole are alternatingly repeated along a circumferential direction of the plasma-generating tube.

5. A molecular beam epitaxy apparatus which has a radical generator according to claim 2.

6. The radical generator according to claim 1, which further comprises a power supply apparatus comprising:
a high-frequency power source for generating high-frequency electric power;
a distributor for distributing the high-frequency electric power output from the high-frequency power source to the first electrode, the coil, and the second electrode, and which includes an impedance matching circuit for matching impedance with the high-frequency power source; and
a regulator for variably controlling the electric power distributed to the first electrode, the coil, and the second electrode according to an external command.

7. A molecular beam epitaxy apparatus which has a radical generator according to claim 6.

8. The radical generator according to claim 1, wherein the connecting tube is inserted into an opening of the supply tube at a connection site between the supply tube and the plasma-generating tube, and the connecting tube is connected to the supply tube by a ring joint member provided around the connecting tube.

9. The radical generator according to claim 8, which further comprises a plurality of second permanent magnets which are disposed along an outer circumference of a zone of the plasma-generating tube where the second capacitively coupled plasma is generated and which localize the second capacitively coupled plasma to about the cylinder center axis of the plasma-generating tube, wherein respective second permanent magnets have been magnetized in the direction orthogonal to the cylinder center axis of the plasma-generating tube, and a plane proximal to the plasma-generating tube has been magnetized as an N pole or an S pole, and two second permanent magnets adjacent each other have inner planes of different magnetic poles such that an N pole and an S pole are alternating repeated along the circumferential direction of the plasma-generating tube.

10. A molecular beam epitaxy apparatus which has a radical generator according to claim 8.

11. The radical generator according to claim 8, wherein an opening of the plasma-generating tube, through which a plasma generated in the plasma-generating tube is released, comprises a tapered portion increasing in diameter toward the downstream, and the second electrode is arranged around an outer wall of the tapered portion.

12. The radical generator according to claim 1, which further comprises a plurality of second permanent magnets which are disposed along an outer circumference of a zone of the plasma-generating tube where the second capacitively coupled plasma is generated and which localize the second capacitively coupled plasma to about the cylinder center axis of the plasma-generating tube, wherein respective second permanent magnets have been magnetized in the direction orthogonal to the cylinder center axis of the plasma-generating tube, and the plane proximal to the plasma-generating tube has been magnetized as an N pole or an S pole, and the two second permanent magnets adjacent each other have inner planes of different magnetic poles such that an N pole and an S pole are alternatingly repeated along the circumferential direction of the plasma-generating tube.

13. A molecular beam epitaxy apparatus which has a radical generator according to claim 12.

14. The radical generator according to claim 12, wherein an opening of the plasma-generating tube, through which a plasma generated in the plasma-generating tube is released, comprises a tapered portion increasing in diameter toward the downstream, and the second electrode is arranged around an outer wall of the tapered portion.

15. The radical generator according to claim 12, wherein the second permanent magnets are disposed inside the second electrode and exposed to the inner space of the second electrode.

16. The radical generator according claim 1, wherein nitrogen is supplied through the supply tube, to thereby generate nitrogen radicals.

17. A molecular beam epitaxy apparatus which has a radical generator according to claim 16.

18. A molecular beam epitaxy apparatus which has a radical generator according to claim 1.

19. The radical generator according to claim 1, wherein the first permanent magnets are disposed inside the first electrode and exposed to the inner space of the first electrode.

* * * * *